United States Patent
Kong et al.

(10) Patent No.: US 9,502,423 B2
(45) Date of Patent: Nov. 22, 2016

(54) SEMICONDUCTOR DEVICE LAYOUT AND METHOD FOR FORMING THE SAME

(71) Applicant: SK hynix Inc., Icheon (KR)

(72) Inventors: Myong Kong, Icheon (KR); Hyo Jin Baek, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/483,063

(22) Filed: Sep. 10, 2014

(65) Prior Publication Data

US 2015/0287729 A1 Oct. 8, 2015

(30) Foreign Application Priority Data

Apr. 4, 2014 (KR) .................. 10-2014-0040423

(51) Int. Cl.
*H01L 29/94* (2006.01)
*H01L 27/108* (2006.01)

(52) U.S. Cl.
CPC ... *H01L 27/10894* (2013.01); *H01L 27/10897* (2013.01); *H01L 29/94* (2013.01)

(58) Field of Classification Search
None
See application file for complete search history.

(56) References Cited

U.S. PATENT DOCUMENTS

| 7,638,821 B2 | 12/2009 | Aoki | |
|---|---|---|---|
| 2007/0045770 A1* | 3/2007 | Aoki | H01L 27/0207 257/516 |
| 2010/0252911 A1* | 10/2010 | Furuta | H01L 23/5223 257/532 |
| 2012/0286341 A1* | 11/2012 | Chen | H01L 27/0805 257/296 |

FOREIGN PATENT DOCUMENTS

KR 10-2012-0098176 A 9/2012

* cited by examiner

*Primary Examiner* — Ali Naraghi

(57) ABSTRACT

A semiconductor includes a gate line having a first portion in a transistor region and a second portion in a decoupling capacitor region.

12 Claims, 5 Drawing Sheets

SEMICONDUCTOR DEVICE LAYOUT AND METHOD FOR FORMING THE SAME

CROSS-REFERENCE TO RELATED APPLICATION

The priority of Korean patent application No. 10-2014-0040423 filed on 4 Apr. 2014, the disclosure of which is hereby incorporated in its entirety by reference, is claimed.

BACKGROUND OF THE INVENTION

Embodiments of the present invention relate to a semiconductor device layout and a method for forming the same, and more particularly to a layout of a decoupling capacitor of a semiconductor device, and a method for forming the same.

With the increasing degree of integration of semiconductor devices (for example, Dynamic Random Access Memory (DRAM)), the demand for higher storage capacity and higher operation speeds is rapidly increasing. Generally, the number of operation circuits is increasing in proportion to the increasing degree of integration of semiconductor devices. In integrated devices, high fluctuation noise may instantaneously occur in a power-supply voltage (VDD) and a ground voltage (VSS) during a read or write operation. In order to address the above-mentioned issues, a decoupling capacitor for filtering noise encountered between the power-supply voltage (VDD) and operation power such as the ground voltage (VSS) has been widely used in the semiconductor devices. The decoupling capacitor is typically arranged in an available space of a peripheral region.

The decoupling capacitor may reduce high-frequency noise, may further provide a power source for the semiconductor device, and may exclude inductance components generated when an external power source is coupled to the semiconductor device, thereby improving impedance from the viewpoint of the external power source.

In a semiconductor device, a decoupling capacitor is typically metal oxide semiconductor (MOS) capacitor having a larger capacitance in a small region. MOS capacitors are classified as NMOS capacitors and PMOS capacitors. Generally, NMOS capacitors have superior characteristics than PMOS capacitors, so that NMOS capacitors have been widely used.

A detailed description of an exemplary case in which an NMOS capacitor is used will hereinafter be described in detail. If a power-supply voltage (VDD) is applied to a gate terminal of the NMOS transistor, and a ground voltage (VSS) is commonly applied to a source terminal, a drain terminal, and a bulk terminal of the NMOS transistor, the NMOS transistor can be used as a capacitor. Theoretically, if a voltage level (Vgs) between the gate and the source is less than a threshold voltage (Vt), the NMOS transistor is not turned on, no current flows, and electric charges are stored in the NMOS transistor, so that the NMOS transistor can be used as a capacitor.

However, the above-mentioned decoupling capacitor may cause two parasitic resistance components. The two parasitic resistance components increase the number of power drops in proportion to a higher parasitic resistance, and thus deteriorate high-frequency operation characteristics. One of the parasitic resistance components is Equivalent Series Resistance (ESR). ESR is unique resistance of the decoupling capacitor, such that the ESR can change and adjust characteristics of the decoupling capacitor. The lower the ESR, the higher the operation characteristics of a high-frequency region. However, metal lines for applying the power-supply voltage (VDD) and the ground voltage (VSS) to the decoupling capacitor need to be formed, and a path resistance occurs in the metal lines. In addition, if the decoupling capacitor is coupled to the metal line, additional metal lines need to be arranged, resulting in an increased size.

BRIEF SUMMARY OF THE INVENTION

Various embodiments are directed to a semiconductor device layout and a method for forming the same that substantially obviate one or more problems due to limitations and disadvantages of the related art.

Embodiments relate to a semiconductor device in which a decoupling capacitor is directly coupled to a gate line of a transistor and loading of a metal line is reduced, such that ESR of a capacitor is reduced and high-speed operation noise can be minimized, and a method for forming the semiconductor device.

In accordance with an aspect of the present disclosure, a semiconductor device includes a gate line having a first portion in a transistor region and a second portion in a decoupling capacitor region.

The semiconductor device may further include the gate line is a single contiguous gate line.

The semiconductor device may further include a first active region overlapping the first portion of the gate line in the transistor region; a second active region overlapping the second portion of the gate line in the decoupling capacitor region; a first contact on a first side of the first active region and the second active line; and a second contact on a second side of the first active region and the second active line.

The semiconductor device may further include a first conductive pattern coupled to the first contact, wherein the first conductive pattern extends along portions of the first and second portions of the gate line.

The semiconductor device may further include a third contact coupled to a first end of the first portion of the gate line that is opposite to the second portion.

The semiconductor device may further include a second conductive pattern coupled to the third contact.

The semiconductor device may further include the first gate line is formed to receive a power-supply voltage through the second conductive pattern.

The semiconductor device may further include the decoupling capacitor region includes a metal oxide semiconductor (MOS) in which a dielectric layer is interposed between the active region and the second portion of the gate line.

The semiconductor device may further include the MOS capacitor receives a ground voltage (VSS).

In accordance with another aspect of the present disclosure, a method for forming a semiconductor device including a transistor region and a decoupling capacitor region, the method comprising: forming a first active region in the transistor region; forming a second active region in the decoupling capacitor region; and forming a gate line crossing the first and second active regions.

The method may further include forming a source/drain region over the active region located at both sides of the gate line; and forming a first contact coupled to the source/drain region.

The method may further include forming a first conductive pattern extending in parallel to the gate line and coupled to the first contact at both sides of the gate line.

The method may further include forming a second contact at one end of the gate line in the transistor region; and forming a second conductive pattern coupled to the second contact.

The method may further include power-supply voltage is applied to the gate line of the transistor region.

The method may further include a ground voltage (VSS) is applied to the gate line of the capacitor region.

It is to be understood that both the foregoing general description and the following detailed description of the present invention are exemplary and explanatory.

DESCRIPTION OF EMBODIMENTS

Reference will now be made in detail to embodiments which are illustrated in the accompanying drawings. Wherever possible, the same reference numbers are used throughout the drawings to refer to the same or similar portions. A semiconductor device and a method for forming the same according to embodiments will hereinafter be described with reference to the accompanying drawings.

Figure 1:
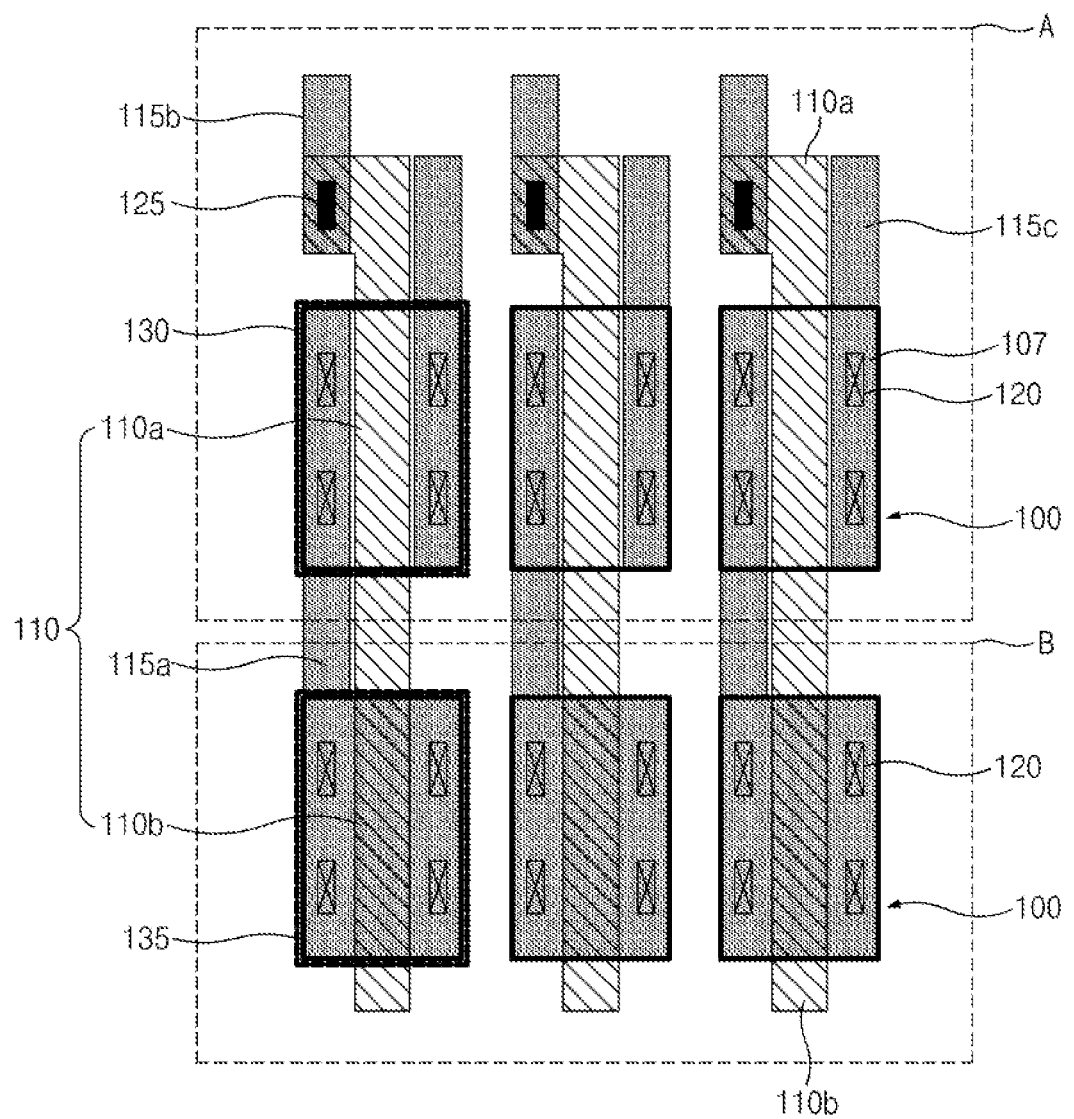
FIG. 1 is a diagram illustrating a semiconductor device according to an embodiment.

FIG. 1 is a diagram illustrating a semiconductor device according to an embodiment.

Referring to FIG. 1, a semiconductor device includes a transistor region A including a plurality of transistors 130 and a decoupling capacitor region B including a plurality of decoupling capacitors 135. In this embodiment, each transistor arranged in the transistor region A and each decoupling capacitor arranged in the decoupling capacitor region B are interconnected through one gate line 110.

The transistor region A will hereinafter be described in detail.

A plurality of independent active regions 100 may be arranged in the transistor region A. For convenience of description and better understanding of the present invention, each active region 100 may be formed as a square pattern, and the scope or spirit of the present invention is not limited thereto. A device isolation film may be located between the active regions 100.

In addition, the device isolation film may overlap with the active region 100, and a first gate line 110a is formed to cross a center portion of the active region 100. In this case, the first gate line 110a may be a gate line 110 located in the transistor region A.

The active region 100 may include a channel region (not shown) of the center portion thereof (i.e., a specific region in which the first gate line 110a overlaps with the active region 100) and a contact region located at both sides of the channel region. A source/drain region 107 may be formed in the contact region, and a plurality of first contacts 120 coupled to the source/drain region 107 may be formed in the contact region.

A first conductive pattern 115a is electrically coupled to the source/drain region 107 through first contacts 120. The first conductive pattern 115a is adjacent to the first gate line 110a, and is arranged in a line extended along the same direction as a long-axis direction of the first gate line 110a at both sides of the first gate line 110a.

A second conductive pattern 115b overlapping with the first gate line 110a is arranged at one end of the first gate line 110a. The second conductive pattern 115b may be electrically coupled to the first gate line 110a through a second contact 125. In this case, a power-supply voltage (VDD) is applied to the semiconductor device through the second conductive pattern 115b coupled to one end of the first gate line 110a.

Meanwhile, several independent active regions 100 may be arranged in the decoupling capacitor region B in the same manner as in the transistor region A, and a device isolation film may be arranged between the active regions 100. A decoupling capacitor is formed in the decoupling capacitor region B. Various elements may be used as the decoupling capacitor. In particular, a MOS capacitor formed to have high capacitance within a small region is generally used as the decoupling capacitor for use in a semiconductor chip.

The MOS capacitor includes an active region 100 formed over a semiconductor substrate (not shown), a second gate line 110b formed to cross a center portion of the active region 100, and a dielectric layer (not shown) interposed between the active region 100 and the second gate line 110b. That is, the MOS capacitor is formed of a stacked structure of the active region 100, the dielectric layer (not shown), and the gate line 110b. In this case, the second gate line 110b may be a gate line 110 located in the decoupling capacitor region B.

A contact region may be arranged in the active region 100 located at both sides of the second gate line 110b, and the first contacts 120 may be arranged in the contact region.

In this case, the first conductive pattern 115a of the decoupling capacitor region B may be formed to overlap with the second gate line 100b.

A power-supply voltage to be applied to the decoupling capacitor of the decoupling capacitor region B is applied to the first gate line 110a, and the semiconductor device may receive the power-supply voltage through the second gate line 110b electrically coupled to the first gate line 110a. Accordingly, the decoupling capacitor may receive the power-supply voltage through the first gate line 110a of the transistor region A, so that the decoupling capacitor can perform a decoupling action.

As described above, according to the semiconductor device of the embodiment, since the first gate line 110a of the transistor region A is directly coupled to the second gate line 110b of the capacitor region, ESR of the semiconductor device becomes largely reduced as compared to the decoupling capacitor coupled to the metal line, resulting in increased efficiency of a compensation capacitor.

Figure 2A:
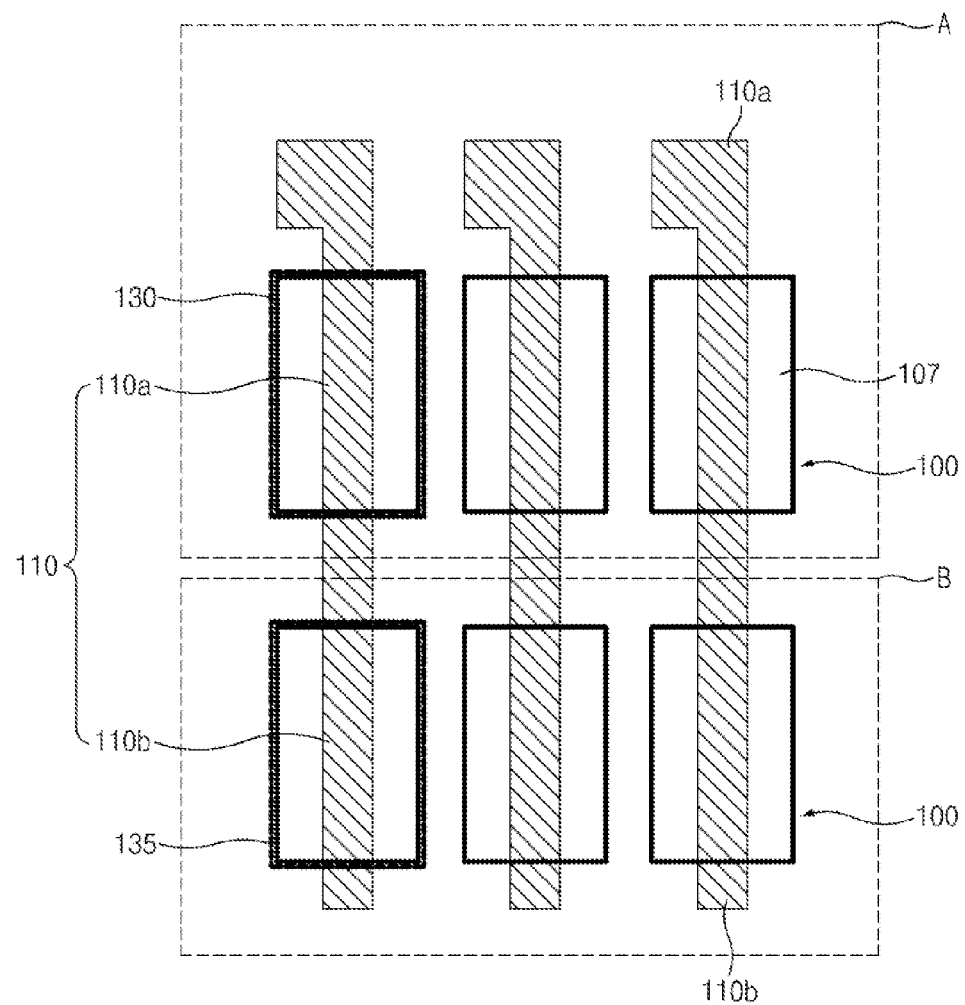
FIGS. 2A to 2C are diagrams illustrating a method for forming a semiconductor device according to an embodiment.
Figure 2B:
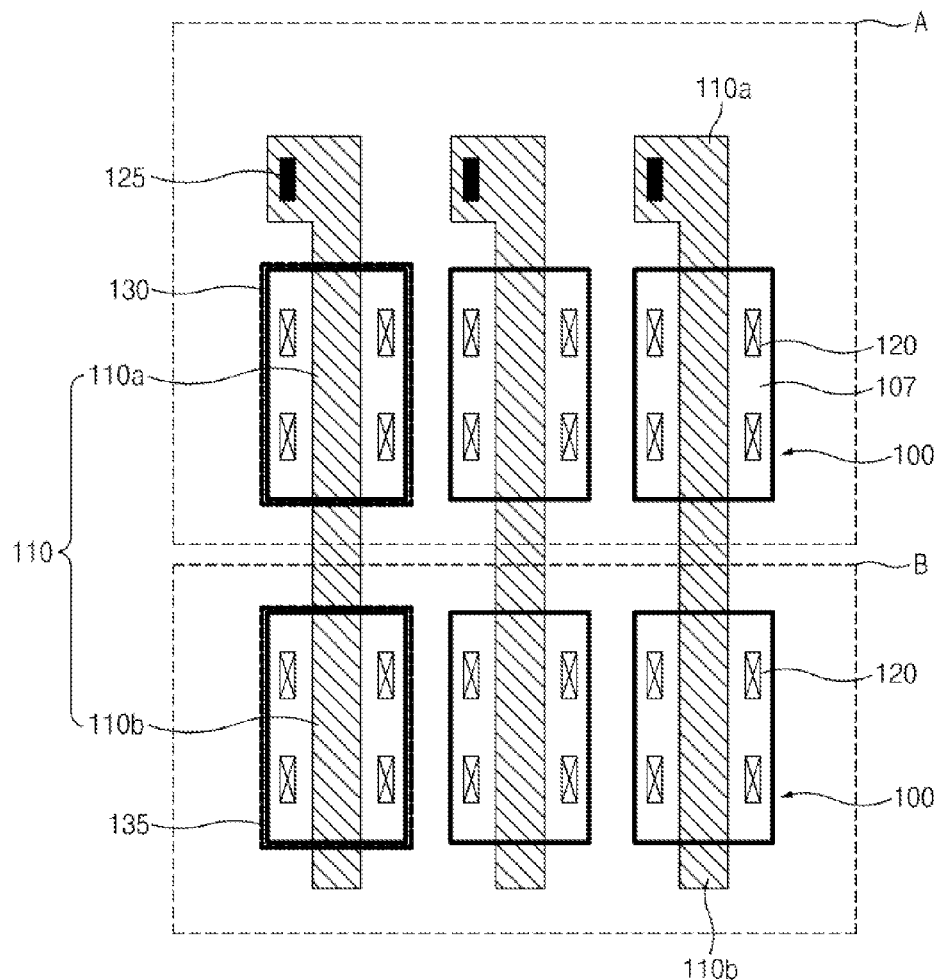
Figure 2C:
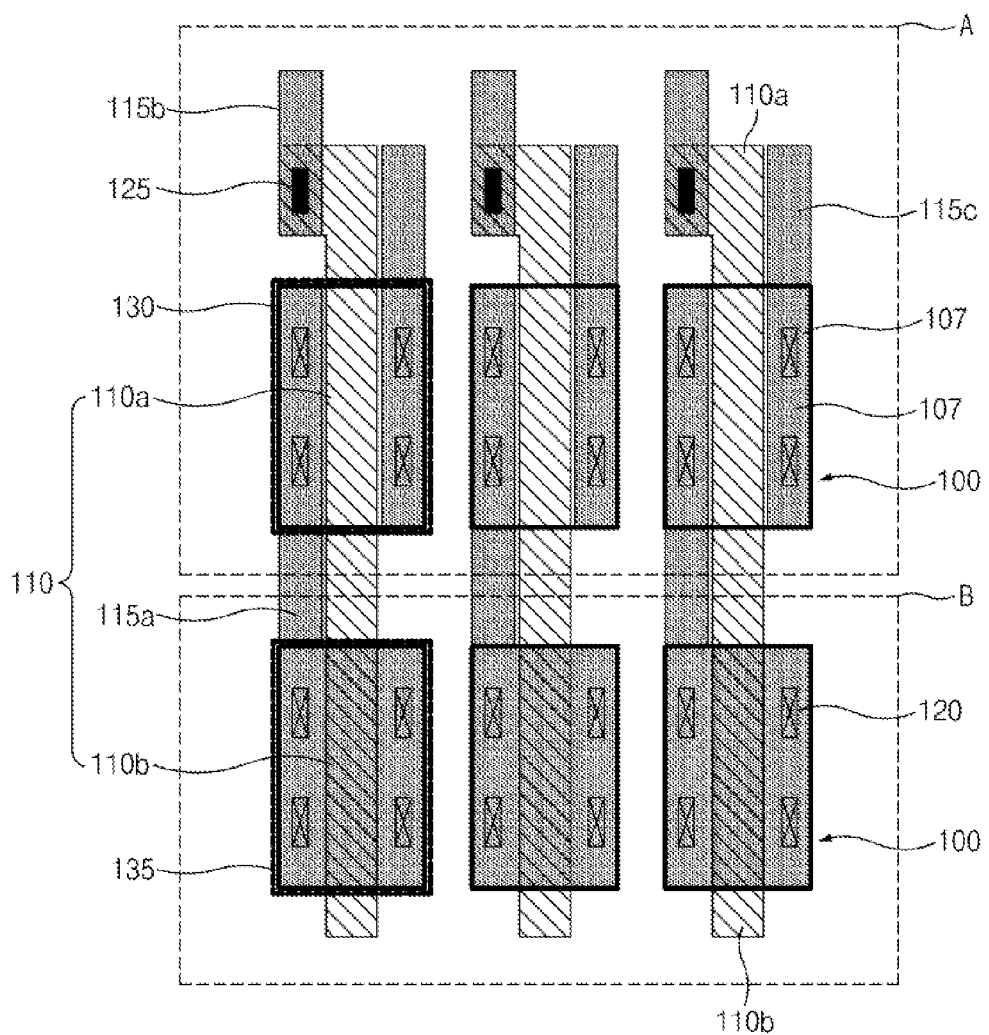

FIGS. 2A to 2C are diagrams illustrating a method for forming the semiconductor device layout shown in FIG. 1 according to an embodiment of the present invention. A method for forming the semiconductor device layout shown in FIG. 1 will hereinafter be described with reference to FIGS. 2A to 2C.

Referring to FIG. 2A, a plurality of independent active regions 100 may be formed over the semiconductor substrate of the transistor region A and the decoupling capacitor region B. In this case, although the active region 100 may be formed in a square shape for convenience of description and better understanding of the present invention, and the scope or spirit of the present invention is not limited thereto.

Thereafter, the gate line 110 is formed to cross a center portion of the active region 100. The gate line 110 may be arranged in such a manner that the active region 100 of the transistor region A and the other active region 100 of the decoupling capacitor region B can simultaneously pass through the gate line 110. The gate line 110 may be formed in a line shape, and may have a smaller critical dimension (CD) than the active region 100. In this case, one gate line 110 located in the transistor region A may be defined as a first gate line 110a, and the other gate line 110 located in the decoupling capacitor region B may be defined as a second gate line 110b.

Referring to FIG. 2B, the active region 100 located at both sides of the gate line 110 is used as a contact region. Each source/drain region 107 may be formed in the contact region, and each of first contacts 120 coupled to the source/drain region 107 may be arranged in the contact region. In addition, a second contact 125 may be arranged at one end of the gate line 110 of the transistor region A.

Referring to FIG. 2C, the first conductive pattern 115a overlaps with the active region 100 located at both sides of the gate line 110, and is electrically coupled to the first contact 120. The first conductive pattern 115a may be formed in a line shape extended along the same direction as a long-axis direction of the gate line 110. In this case, one of the conductive patterns 115 arranged at both sides of the gate line 110 may be coupled to the transistor region A and the decoupling capacitor region B.

A second conductive pattern 115b is electrically coupled to the second contact 125 located at one end of the gate line 110. A power-supply voltage to be applied to the decoupling capacitor of the decoupling capacitor region B through the second conductive pattern 115b is applied to the first gate line 110a, and the semiconductor device may receive the power-supply voltage through the second gate line 110b electrically coupled to the first gate line 110a. Accordingly, the decoupling capacitor may receive the power-supply voltage through the first gate line 110a of the transistor region A, so that the decoupling capacitor can perform a decoupling action.

Figure 3:
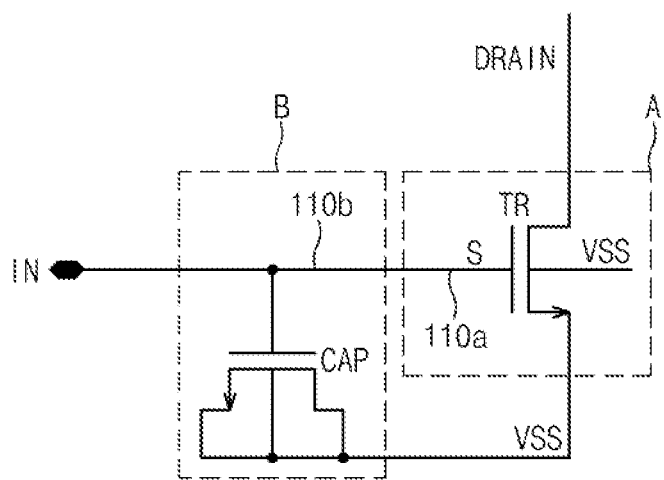
FIG. 3 is a circuit diagram illustrating a semiconductor device according to an embodiment.

FIG. 3 is a circuit diagram illustrating a semiconductor device according to an embodiment of the present invention. In more detail, a circuit structure corresponding to the semiconductor device layout shown in FIG. 1 is shown in FIG. 3.

A semiconductor device including the transistor region A and the decoupling capacitor region B is shown in FIG. 3. The transistor region A includes a first gate line 110a and a source/drain region 107. A power-supply voltage may be applied to the first gate line 110a.

In addition, a MOS capacitor acting as a decoupling capacitor is contained in the decoupling capacitor region B, and the MOS capacitor includes a second gate line 110b.

In this case, the first gate line 110a of the transistor region A and the second gate line 110b of the decoupling capacitor B may be coupled to one gate line 110.

As described above, the first gate line 110a of the transistor region A is directly coupled to the gate line 110b of the decoupling capacitor B so that loading of the metal line disappears, resulting in ESR reduction of the capacitor and the occurrence of minimum noise of a high-speed operation.

As is apparent from the above description, the semiconductor device layout in which a decoupling capacitor is directly coupled to a gate line of a transistor according to the embodiments has the following effects.

First, the metal line coupled to the decoupling capacitor need not be arranged, and loading of the metal line disappears, resulting in ESR reduction of the decoupling capacitor.

Second, efficiency of the decoupling capacitor unavoidably increases in response to ESR reduction, and the occurrence of noise of a high-speed operation can be minimized.

Third, since the decoupling capacitor is directly coupled to the gate line, an additional metal line need not be formed. Therefore, a spatial limitation disappears so that a regional gain is achieved.

Those skilled in the art will appreciate that the present invention may be carried out in other specific ways than those set forth herein without departing from the spirit and essential characteristics of the present invention. The above exemplary embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an exemplary embodiment of the present invention or included as a new claim by a subsequent amendment after the application is filed.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or nonvolatile memory device. Other additions, subtractions, or modifications are obvious in view of the present disclosure and are intended to fall within the scope of the appended claims.

What is claimed is:

1. A semiconductor device comprising:
a first active region in a transistor region;
a second active region in a decoupling capacitor region;
a gate line having a first portion in the transistor region and a second portion in the decoupling capacitor region;
a first contact on a first side of the gate line in the first active region;
a second contact on a second side of the gate line in the first active region;
a third contact on a first side of the gate line in the second active region;
a fourth contact on a second side of the gate line in the second active region;
a first conductive pattern disposed over the first, third and fourth contacts, and coupling the first, third and fourth contacts to one another;
wherein the first active region is isolated from the second active region.

2. The semiconductor device according to claim 1, the gate line is a single contiguous gate line.

3. The semiconductor device according to claim 1, further comprising:
a fifth contact coupled to a first end of the first portion of the gate line that is opposite to the second portion.

4. The semiconductor device according to claim 3, further comprising:
a second conductive pattern coupled to the fifth contact.

5. The semiconductor device according to claim 4, wherein the first portion of the gate line receives a power-supply voltage through the second conductive pattern.

6. The semiconductor device according to claim 1, wherein the decoupling capacitor region includes a metal oxide semiconductor (MOS) in which a dielectric layer is interposed between the second active region and the second portion of the gate line.

7. The semiconductor device according to claim 6, wherein the MOS capacitor receives a ground voltage (VSS).

8. A method for forming a semiconductor device including a transistor region and a decoupling capacitor region, the method comprising:
  forming a first active region in the transistor region;
  forming a second active region in the decoupling capacitor region; and
  forming a gate line crossing the first and second active regions;
  forming a first contact and a second contact on opposing sides of the gate line in the first active region;
  forming a third contact and a fourth contact on opposing sides of the gate line in the second active region; and
  forming a first conductive pattern over the first, third and fourth contacts that couples the first, third and fourth contacts to each other,
  wherein the first active region is isolated from the second active region.

9. The method according to claim 8, further comprising:
  forming a source/drain region at the active region located at both sides of the gate line.

10. The method according to claim 8, further comprising:
  forming a fifth contact at one end of the gate line in the transistor region; and
  forming a second conductive pattern coupled to the second contact.

11. The method according to claim 8, wherein a power-supply voltage is applied to the gate line of the transistor region.

12. The method according to claim 8, wherein a ground voltage (VSS) is applied to the gate line of the capacitor region.

* * * * *